United States Patent [19]

Fiedler et al.

[11] Patent Number: 4,677,035

[45] Date of Patent: Jun. 30, 1987

[54] HIGH STRENGTH NICKEL BASE SINGLE CRYSTAL ALLOYS

[75] Inventors: Louis J. Fiedler, Trumbull; Subhash K. Naik, Milford, both of Conn.

[73] Assignee: Avco Corp., Greenwich, Conn.

[21] Appl. No.: 678,802

[22] Filed: Dec. 6, 1984

[51] Int. Cl.⁴ ............................................. B32B 15/01
[52] U.S. Cl. ....................................... 428/680; 148/3;
148/133; 148/162; 148/404; 420/448; 420/450;
428/678; 415/200; 29/156.8 R; 29/156.8 B
[58] Field of Search .................. 148/3, 404, 133, 162;
420/448, 450; 428/678, 680; 415/200; 29/156.8
R, 156.8 B

[56] References Cited

U.S. PATENT DOCUMENTS 4,459,160 7/1984 Meetham et al. .................. 148/162

Primary Examiner—Stephen J. Lechert, Jr.
Attorney, Agent, or Firm—Perman & Green

[57] ABSTRACT

Disclosed are novel nickel-base single crystal alloy compositions consisting essentially of, by weight, about 8.0–14.0% chromium, 1.5–6.0% cobalt, 0.5–2.0% molybdenum, 3.0–10.0% tungsten, 2.5–7.0% titanium, 2.5–7.0% aluminum, 3.0–6.0% tantalum and the balance nickel.

A combination of thermal treatment and coating of the novel alloys to enhance their mechanical properties is also disclosed.

7 Claims, 5 Drawing Figures

HIGH STRENGTH NICKEL BASE SINGLE CRYSTAL ALLOYS

BACKGROUND OF THE INVENTION

1. Field of the Invention

This invention relates, in general, to novel nickel-base single crystal alloys and, in particular, to such alloys having high strength at elevated temperatures. More specifically, the present invention relates to novel nickel-base single crystal alloys which retain their high temperature mechanical properties after prolonged or repeated exposure to elevated temperatures, the single crystal alloys being capable of being cast into desired shapes, such as turbine blades, vanes and other parts used in high temperature gas turbine engines. Even more specifically, the present invention relates to novel nickel-base single crystal alloys which can be coated with conventional coatings with an accompanying heat treatment to impart high temperature oxidation/sulfidation resistance thereto without the formation of deleterious phases at the alloy/coating substrate interface.

2. Description of the Prior Art

Schweizer et al., U.S. Pat. No. 4,222,794, discloses a nickel-base single crystal superalloy for use at elevated temperatures having a restricted composition consisting of 4.5–6.0% chromium, 5.0–5.8% aluminum, 0.8–1.5% titanium, 1.7–2.3% molybdenum, 4.0–6.0% tungsten, 5.5–8.0% tantalum, 1.0–5.0% rhenium, 0.2–0.6% vanadium, 0–7.0% cobalt and the balance nickel. This patent also discloses a method of heat treating the alloys described therein at a specific temperature range. Although the Schweizer et al patent discloses a single crystal alloy, said alloy differs chemically from the alloy of the present invention. For example, the alloy of the present invention is significantly higher in chromium content, titanium content and titanium to aluminum ratio and does not contain rhenium and vanadium.

Gell et al, U.S. Pat. No. 4,116,723 discloses single crystal nickel base superalloys free from intentional additions of cobalt, boron, and zirconium. Gell et al discusses the avoidance of the development in the single crystal alloys of deleterious phases after long term exposure at elevated temperatures (i.e. alloy instability), the phases being of two general types, sigma and mu. Sigma is undesirable because of its brittle nature while mu is undesirable because the phase ties up large amounts of the refractory solid solution strengtheners thus weakening the remaining alloy phases. The sigma and mu phases are termed TCP phases for topologically closed packed phases and one of their common properties is that they all contain cobalt. Gell et al eliminates cobalt in the claimed single crystal nickel base alloys to inhibit the formation of TCP phases therein. Unexpectedly, the presence of cobalt in the single nickel base alloys of the present invention does not induce the formation of TCP phases. Also, the ratio of titanium to aluminum disclosed by Gell et al is lower than that in the alloy of the present invention.

Shaw, U.S. Pat. No. 4,207,098, discloses a relatively low-strength nickel-base polycrystalline alloy consisting essentially of 14–22% chromium, 5–25% cobalt, 1–5% tungsten, 0.5–3% tantalum, 2–5% titanium, 1–4.5% aluminum (with the sum of titanium plus aluminum being 4.5–9%), 0–2% niobium, 0.31–1.2% boron, 0–3.55 molybdenum, 0–0.5% zirconium, 0–0.2% in total yttrium or lanthanum or both, 0–0.1% carbon, and the balance nickel. The Shaw poly-crystalline alloy, which must contain boron, is chemically different from the single crystal alloy of the present invention.

Ghosh, U.S. Pat. No. 4,126,495, discloses a low strength nickel-base polycrystalline alloy consisting essentially of 6.75–10.0% aluminum, 8.0–12.0% chromium, 0.8–2.5% titanium, 2.0–6.0% cobalt, 2.5–4.0% molybdenum, 0.95–4.85% tantalum, 0–1.25% tungsten, 0–0.6% columbium, 0–1.0% carbon, 0–1.0% boron, 0–0.8% zirconium, 0–1.0% rare earths, 0–1.0% beryllium and the balance nickel. The Ghosh polycrystalline alloy contains lower amounts of tungsten and higher amounts of molybdenum than the single crystal alloy of the present invention.

Thielemann, U.S. Pat. No. 2,948,606, discloses a low-strength nickel-chromium-cobalt base polycrystalline alloy composed of about 15.0–25.0% chromium, 5.0–30.0% cobalt, 0.5–4.0% titanium, 2.0–5.0% aluminum, 1.0–5.0% columbium or tantalum or mixtures thereof, 5.0–11.0% tungsten and the balance essentially nickel. The Thielmann polycrystalline alloy which contains significantly higher amounts of chromium, a lower combined titanium-aluminum content and no molybdenum is chemically different from the single crystal alloy of the present invention.

Dalai et al, U.S. Pat. No. 3,807,993, discloses a polycrystalline material with a significantly higher cobalt content than the single crystal alloy of the present invention and, further, containing grain boundary strengtheners such as carbon, boron, zirconium and hafnium. The absence of these grain boundary strengtheners significantly increases the melting temperature and can allow higher heat treatment temperatures with attendant increases in strength. Moreover, higher melting temperatures allow higher engine use temperatures.

Two Restall et al patents, U.S. Pat. Nos. 3,902,900 and 3,922,168 disclose an intermetallic compound material containing a first group including nickel and at least one of the elements chromium, cobalt, molybdenum and tungsten within the range of 72–83 atomic percent and a second group containing aluminium (12–26 atomic percent) in combination with at least one of the elements titanium, niobium, and tantalum with the range of 17–28 atomic percent.

U.S. Pat. Nos. 4,249,943; 4,043,841; 3,785,809; 3,615,376; and 3,486,887 disclose alloys containing nickel, cobalt, chromium and aluminum together with one or more of the following elements: manganese, silicon, carbon, niobium, boron, zirconium among others.

U.S. Pat. Nos. 2,971,838; 3,276,866; 3,926,586; 3,973,952; and 4,268,308 disclose a variety of compositions containing nickel, chromium and aluminum with one or more of the following elements: zirconium, carbon, columbium, boron and silicon, among others.

Still other patents in the nickel base super-alloy area include U.S. Pat. Nos. 2,621,122; 2,781,264; 2,912,322; 2,994,605; 3,046,108; 3,166,412; 3,188,204; 3,287,110; 3,304,176; and 3,322,534.

Nickel-base superalloys which have been used over the years to fabricate gas turbine engine components typically contain, aside from certain levels of chromium, cobalt, aluminum, titanium and refractory metals (e.g., tungsten, molybdenum, tantalum and columbium) other elements such as carbon, boron and zirconium which act as grain boundary strengtheners.

Gas turbine blades are most commonly formed by casting and the process most often utilized produces parts having equiaxed non-oriented grains. Since the high temperature properties of metals are generally dependant upon grain boundary properties, efforts have been made to strengthen such boundaries, by addition of carbon, boron and/or zirconium, as discussed above, or to reduce or eliminate the grain boundaries transverse to the major stress axis of the part. One method of eliminating such transverse boundaries is directional solidification, described in U.S. Pat. No. 3,260,505. The effect of directional solidification is to produce an oriented microstructure of columnar grains whose major axis is parallel to the stress axis of the part and which has minimal or no grain boundaries perpendicular to the stress axis of the part. A further extension of this concept is the utilization of single crystal parts in gas turbine blades, as described in U.S. Pat. No. 3,494,709. The obvious advantage of the single crystal blade is the complete absence of grain boundaries as potential weaknesses. Thus, the mechanical properties of the single crystal are completely dependent upon the inherent mechanical properties of the material. While single crystal nickel-base alloys are generally known, there exists a need for such alloys having a combination of properties including improved mechanical strength, especially over prolonged and/or repeated exposure to elevated temperatures and the ability to be cast to desired shapes, such as turbine blades and parts.

While U.S. Pat. No. 4,116,723 relates to heat treatment of single crystal alloys, precipitation-hardened alloys having the high temperature mechanical properties of the instant invention (e.g., retention of high temperature properties after prolonged or repeated exposure to elevated temperatures) are not obtained.

It is therefore, an object of the present invention to provide a novel alloy composition which is devoid of the above-noted disadvantages.

It is another object of this invention to provide a single crystal nickel base alloy composition which retains its high strength and exhibits long term phase stability after prolonged and/or repeated exposure to elevated temperatures.

It is a further object of this invention to provide a novel heat-treated, coated alloy composition with enhanced mechanical properties.

It is still another object of this invention to provide single crystal alloy compositions which are compatible with conventional high temperature coatings such as diffused aluminides and do not exhibit deleterious TCP phases at the coating/single crystal alloy interface.

It is yet a further object of this invention to provide a novel high strength, single crystal nickel base alloy which may be cast to desired shapes, such as turbine blades and other parts used in high temperature gas turbine engines.

It is yet another objective of this invention to provide a novel nickel base single crystal alloy composition having exceptional coated oxidation and sulfidation resistance and high strength at elevated temperatures.

It is yet a further object of this invention to provide a novel high strength single crystal alloy which may be cast to desired shapes (for example turbine blades, vanes or other parts) and can be used as coated or uncoated parts in high temperature gas turbines.

SUMMARY OF THE INVENTION

The foregoing objects, and others, are accomplished in accordance with this invention, generally speaking, by providing a novel nickel-base single crystal alloy composition consisting essentially of, by weight, about 8.0% to about 14.0% chromium; about 1.5% to about 6.0% cobalt; about 0.5% to about 2.0% molybdenum; about 3.0% to about 10.0% tungsten; about 2.5-7.0% titanium; about 2.5% to about 7.0% aluminum; about 3.0% to about 6.0% tantalum; and the balance nickel.

The novel nickel base single crystal alloy compositions of the present invention can be coated with conventional coatings such as MCrAlY, overlay coatings and aluminide coatings with an accompanying heat treatment to impart high temperature oxidation/sulfidation resistance to the alloy compositions without the formation of deleterious TCP phases at the single crystal alloy/coating interface.

DETAILED DESCRIPTION OF THE INVENTION

Figure 1:
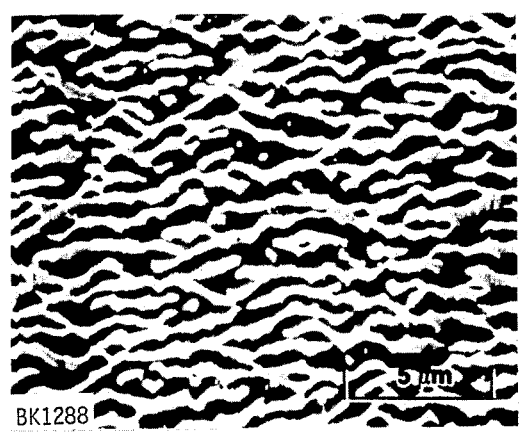
FIG. 1 is a photomicrograph (5000× magnification) of the microstructure of a first single crystal nickel base alloy substrate prepared in accordance with the present invention (Alloy A, as hereinafter described), the substrate having been subjected to stress-rupture conditions of 1800° F./20 ksi for 1000 hours.

According to the present invention, a novel nickel-base single crystal alloy composition having high strength at prolonged or repeated exposure to elevated temperatures, is provided which consists essentially of about 8.0% to about 14.0% chromium; about 1.5% to about 6.0% cobalt; about 0.5% to about 2.0% molybdenum; about 3.0% to about 10.0% tungsten; about 2.5% to about 7.0% titanium; about 2.5% to about 7.0% aluminum; about 3.0% to about 6.0% tantalum; and the balance nickel.

Preferred compositions of the present invention consist essentially of about 9.0% to about 12.0% chromium; about 2.5% to about 5.0% cobalt; about 0.8% to about 1.5% molybdenum; about 4.0% to about 8.0% tungsten; about 2.5% to about 5.0% titanium; about 2.0% to about 6.0% aluminum; about 4.0% to about 5.0% tantalum; and the balance nickel.

The composition of the present invention is produced in single crystal form by known casting techniques (melting and directionally solidifying to produce a single crystal material); heat treating the material at temperatures of between about 2340° F. and about 2400° F. for about 1 to about 4 hours and preferably at temperatures of between about 2340° F. and about 2365° F. for about 2 to about 3 hours; rapidly cooling the material at a rate of about 150° F. to about 250° F. per minute for at least about 6 minutes; and reheating the material to between about 1400° F. and about 2050° F. and holding the material within this temperature range for about 2 to about 24 hours, in either single or multiple reheating cycles.

By practicing the heat treatment cycle just described, very fine (less than 1 μm size) gamma prime particles can be formed in the gamma matrix thereby improving the creep resistance of the alloy.

The single crystal nickel based alloy compositions of the present invention while possessing high strength at prolonged or repeated exposure to high temperatures are susceptible to the accelerated corrosive effect of the hot gas environment in which components fabricated from the alloys are exposed to when used in gas turbines.

To prevent unacceptably rapid oxidation and corrosion rates, protective coatings of the type normally employed in the gas turbine industry can be applied to single crystal nickel base alloy substrates of the present invention without the formation of deleterious TCP phases at the coating/substrate interface.

Diffused aluminide coatings and MCrAlY overlay coatings are examples of coating materials which can be successfully employed as protective coatings for the single crystal nickel base alloy of the present invention.

Aluminide coatings are produced by diffusion of aluminum into the single crystal nickel base alloy substrate and the reaction of aluminum with the alloy to produce intermetallic compounds. In high temperature use, the surface of the alloy substrate develops an alumina layer which acts as a barrier to further oxidation of the coated component. MCrAlY coatings are themselves oxidation resistant and do not depend upon any reaction with or diffusion into a substrate. In MCrAlY coatings in use today, M represents primarily nickel or cobalt alone or mixtures of nickel or cobalt with up to about 9% molybdenum, and preferably about 1 to 3% molybdenum wherein the metal or metals represented by M comprise about 30 to 75 percent by weight of the coating, chromium comprises about 10 to about 40 percent by weight of the coating, aluminum comprises about 5 to about 20 percent by weight of the coating and yttrium comprises about 0.1 to about 1.0 percent by weight of the coating. Optionally small amounts, e.g. about 0.1 to about 10% by weight of a metal selected from Hf, Si, Mn, Pt and mixtures thereof may be also incorporated in the MCrAlY coating.

The aluminide coating may be conveniently deposited on the single crystal nickel base alloy substrate by a pack method. In this method, the substrate to be coated is thoroughly cleaned to remove foreign debris from the substrate which is then packed in a powdered NiAl alloy containing about 22 to about 40% by weight aluminum. The pack is heated in a vacuum furnace with the pack held at about 1900° to about 2050° F. for about 2 to about 8 hours whereby a coating thickness of between about 40 to about 120 μm is developed on the substrate surface.

The MCrAlY overlay coating is applied to the single crystal nickel based alloy substrate at a thickness varying from about 40 to about 200 μm and preferably about 70 to about 120 μm. Among the methods by which the MCrAlY overlay coating may be applied to the substrate include conventional physical vapor deposition processes as for example low pressure plasma spray (LPPS) or sputtering. A diffusion cycle of about 1900° to 2050° F. for 2 to 4 hours is used after application of the coating.

Sputtering is a coating process wherein the particles are liberated from a target surface composed of the MCrAlY alloy by bombardment of energetic ions and then accelerated towards the single crystal nickel based alloy substrate under the influence of an applied high voltage in a gas at $10^{-1}$ Torr or less to deposit the required coating. It is preferred, that the MCrAlY coating be applied to the nickel base single crystal alloy substrate of the present invention by means of a LPPS process.

In a LPPS process, controlled amounts of the coating powder alloy are introduced in the plasma stream of the spray gun. The powder becomes molten and is projected at a very high velocity on the preheated (in the order of about 1,750° F.) surface of the part to be coated which is contained within a vacuum chamber under pressure of about $10^{-4}$ Torr or greater. Upon impact against the surface to be coated, the coating alloy particles transfer thermal and mechanical energy to the substrate, producing forces which favor fusing and bonding, thus producing a dense and adherent coating. Deposition time is controlled to obtain a coating thickness of between about 0.070 to about 120 μm and an acceptable density of 98%. Specimens are glass bead peened at 6-7 N intensity and diffusion heat treated at 1,065° C. for about 4 hours.

As will hereinafter be illustrated, the temperatures generally employed to diffuse aluminide and MCrAlY coating, e.g., 1900°-2050° F. do not deleteriously effect the physical properties of the nickel base single crystal alloys of the present invention which are subjected to such coating processes, such temperatures having been found to be compatible with the aging kinetics of the alloy substrate.

The present invention may be better understood through reference to the following examples which are meant to be illustrative rather than limiting.

EXAMPLE I

A pair of single crystal nickel base alloy compositions of the present invention were cast by differential solidification and cooled to room temperature. The cast alloys were then heat treated between 2330°-2350° F. for 2 to 4 hours, rapidly cooled at the rate between 100°-250° F. for 4-6 hours and then double aged at 1600° for 20 hours. The heat treated alloys had the following composition and physical properties:

TABLE

| Element | Alloy A | Alloy B |
|---------|---------|---------|
| Cr | 10.27 | 9.8 |
| Mo | 0.96 | 0.86 |
| Ta | 4.78 | 4.55 |
| Ti | 3.20 | 3.42 |
| Al | 4.58 | 4.11 |
| Co | 2.49 | 4.0 |
| W | 6.68 | 7.05 |
| Ni | Balance | Balance |
| $NV_{3B}$ | 2.24 | 2.13 |

TABLE-continued

| Element | Alloy A | Alloy B |
| --- | --- | --- |
| Solution Temp (°F.) | 2350 | 2350 |
| Incipient Melt (°F.) | 2375 | 2375 |

*$NV_{3B}$ means electron vacancy number. $NV_{3B}$ is calculated based on phase computation (PHACOMP) which utilizes computerized calculations to predict and control the tendency of superalloys to precipitate TCP compounds.

It is well known to those skilled in the art ("Superalloys" page 275, John Wiley & Sons (1972)) that the calculated electron vacancy numbers of Alloys A and B are indicative of long-term stability against precipitation of TCP phases. Generally, alloys having $NV_{3B}$ values greater than 2.5 are prone to the formation of TCP phases.

The photomicrograph of FIG. 1 shows the microstructure of Alloy A after exposure to stress rupture conditions at 1800° F. and an applied load of 20 ksi for 1800 hours. The photomicrograph indicates the distribution in the alloy microstructure of gamma with an interconnecting structure of gamma prime plates with the plate faces oriented perpendicular to the <001> stress axis. This morphology contributes to the superior strength exhibited by these alloys by diminishing cross-slip. Excellent long-term phase stability at high temperatures is also achieved due to the absence of any deleterious TCP phases.

Figure 2:
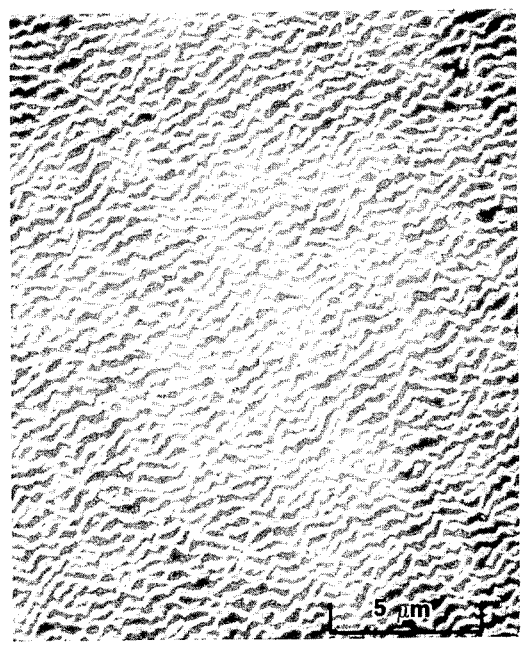
FIG. 2 is a photomicrograph (5000× magnification) of the microstructure of a second single crystal nickel base alloy substrate prepared in accordance with the present invention (Alloy B, as hereinafter described) after having been subjected to stress rupture conditions of 1800° F./32 ksi for 263.3 hours.

Similarly the photomicrograph of FIG. 2 shows the gamma/gamma prime plate-like composite microstructure from in Alloy B after exposure to stress rupture conditions at 1800° F. and an applied load of 32 ksi for 263.3 hours. Also, as in Alloy A, there is an absence of the deleterious TCP phases.

The superior long-term phase stability exhibited by the single crystal nickel base alloys of the present invention as represented by Alloys A and B is achieved in spite of the face that the alloys contain appreciable amounts of cobalt, e.g., Alloy A contains 2.5% and Alloy B contains 4.0% by weight cobalt. The presence of cobalt at the indicated concentrations in the single crystal nickel base alloys of the present invention does not induce the precipitation of deleterious TCP phases which result is unexpected in view of the teachings of U.S. Pat. No. 4,116,723, previously discussed.

EXAMPLE II

Alloy A prepared in Example I was subjected to a standard heat treatment cycle for the purpose of developing a very fine (less than 1 μm size) gamma prime particle in the gamma matrix, the heat treatment cycle being 2350° F. for 2 hours, followed by aging at 1800° F. for 4 hours and concluding with double aging at 1600° F. for 20 hours.

Figure 3:
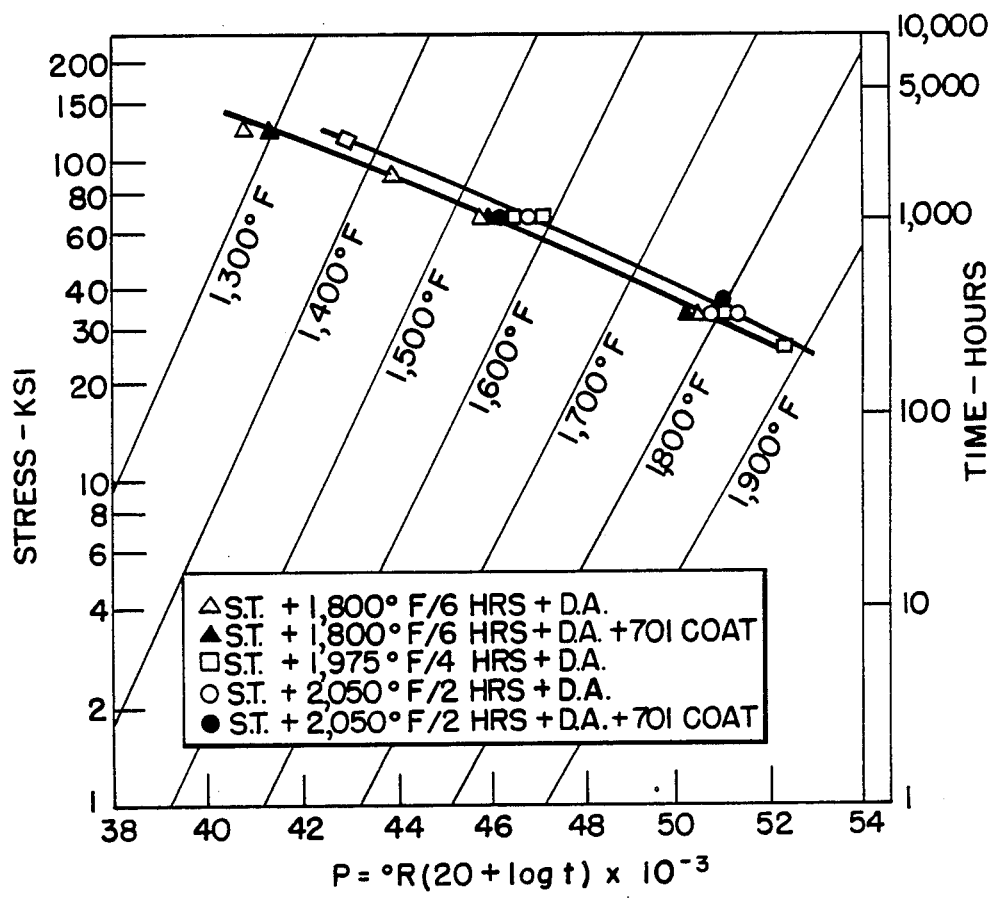
FIG. 3 is a Larson-Miller Plot showing stress-rupture properties of a first single crystal nickel base alloy prepared in accordance with the present invention (Alloy A) as well as the stress-rupture properties of the alloy coated with a diffused aluminide coating in accordance with the present invention.

The heat treated Alloy A test specimen was subjected to stress rupture conditions at 1400° F./110 ksi, 1600° F./65 ksi and 1800° F./32 ksi to generate the Larson-Miller curve (#1) found in FIG. 3 which plots the stress-rupture life properties of the alloy.

A second test specimen of alloy A prepared in Example I was first coated with a 70 μm coating of an aluminide (701) using a pack process wherein the substrate was imbedded in a powder pack containing a mixture of Cr-Al powder, $Al_2O_3$ and the necessary amount of activator ($NH_4$) and then heated in a vacuum furnace at 1900° F. for 5 hours to obtain the desired NiAl coated specimen.

The NiAl coated Alloy A specimen was subjected to a heat treat/coating of 2350° F./2 hours, 1975° F./4 hours and 1600° F./20 hours.

The heat treated aluminide coated Alloy A test specimen was also subjected to stress rupture conditions at 1400° F./110 ksi, 1600° F./65 ksi and 1800° F. to generate the Larson-Miller curve 1 of FIG. 3.

A comparison of the Larson-Miller curves 1 and 2 in FIG. 3 indicates that the diffused aluminide coating did not degrade the stress rupture life of Alloy A. The Larson-Miller plot graphically illustrates the stress rupture properties of the aluminide coated Alloy A subjected to various thermal cycles, namely, in the 1900° to 2050° F. region encountered slight increases in stress rupture properties. The stress rupture properties of the aluminide coated Alloy A (curve 2) when compared to uncoated Alloy A test specimens clearly indicates that the alloy compositions of the present invention are amenable to coating processing in the temperature range of 1900° to 2100° F. without any deterioration in physical properties as a result of such thermal exposures. Thus the single crystal alloy of the present invention may be coated to enhance its oxidation/sulfidation resistance without detriment to its physical properties with conventional coatings such as the diffused aluminide type or MCrAlY type which coating applications require processing temperatures typically in the 1900° to 2050° F. range.

It is not uncommon that exposure to temperature ranges of 1900° to 2050° will produce a decline in the physical properties or conventional superalloys and particularly cobalt containing polycrystalline alloys of the type described in U.S. Pat. No. 3,807,993, previously described. Thus, the processing temperatures used for the application of conventional coatings which impart oxidation/sulfidation resistance to the alloy substrate are compatible with the aging kinetics of the single crystal alloy compositions of the present invention so as not to produce any degradation of the properties of the alloy.

Figure 4:
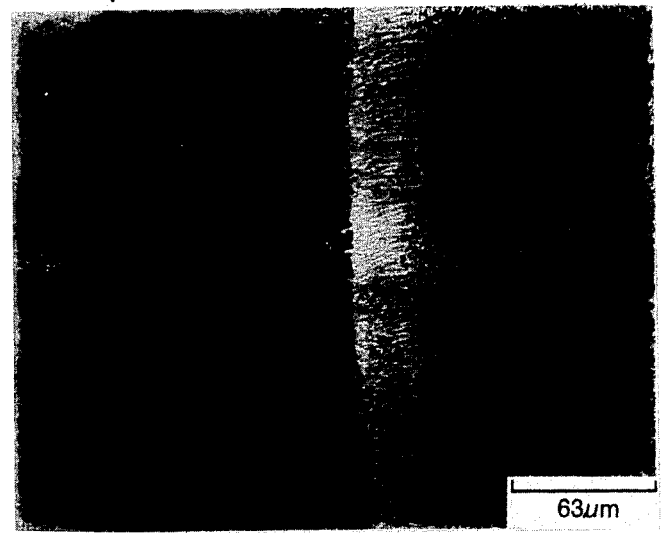
FIG. 4 is a photomicrograph (400× magnification) of a first single crystal nickel base alloy of the present invention (Alloy A) coated with an aluminide coating and then subjected to stress-rupture conditions of 1800° F./32 ksi for 330 hours.

The photomicrograph of FIG. 4 shows the microstructure of the aluminide coated Alloy A after exposure to stress rupture conditions at 1800° F. and an applied load of 32 ksi for 330 hours. An inspection of the photomicrograph indicates the absence of any deleterious TCP phases at the coating/alloy interface due to prolonged high temperature/stress conditions. As the photomicrograph in FIG. 2 indicates that no deleterious TCP phases were precipitated in the Alloy A substrate near the interface due to interdiffusion of the elements, it can be concluded that Alloy A is compatible with the aluminide coating and is tolerant toward changes in composition due to coating-alloy substrate interactions.

EXAMPLE III

A MCrAlY coating composed of 68.4% by weight Ni, 12% by weight Co, 18% by weight Cr, 12% by weight Al 1% by weight Mo and 0.6% by weight Y was deposited on an Alloy B substrate by a LPPS process.

Test specimens of the MCrAlY coated Alloy B prepared above as well as aluminide coated Alloy A prepared in Example II were tested for oxidation/sulfidation resistance performance using a fuel (JP-5) fired rig facility.

For purposes of comparison, an aluminide coated C101 alloy known to exhibit excellent oxidation/sulfidation resistance was also tested. About 0.2% sulfur was added to the JP-5 fuel and the salt/air ratio was maintained at 6 ppm. A six minute, two temperature set point cycle was utilized with the specimens being held at 1650° F. for two minutes and 1950° F. for 2 minutes. This represented a combined oxidation/corrosion cycle with hot corrosion (sulfidation) being more active at 1650° F. and oxidation being more active at 1950° F.

Figure 5:
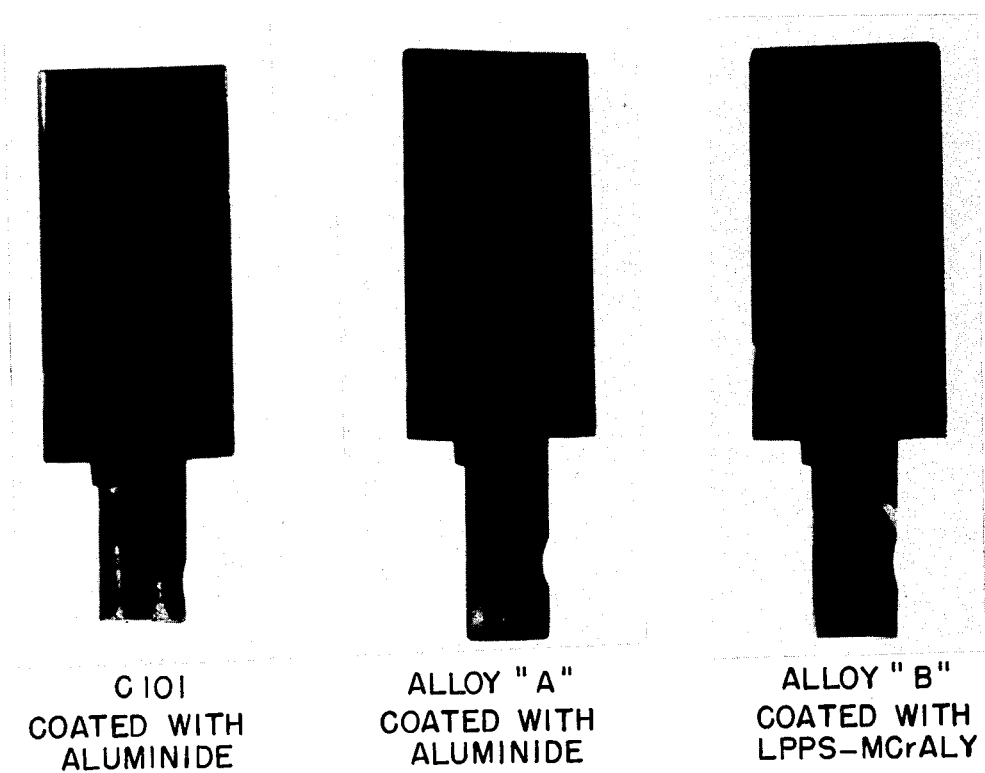
FIG. 5 is a photograph showing the appearance of a prior art nickel-based equiax alloy, C101 coated with an aluminide coating, a first single crystal nickel base alloy of the present invention (Alloy A) coated with the same aluminide coating and a second single crystal nickel based alloy of the present invention (Alloy B) coated with a MCrAlY coating, all three coated substrates having been subjected to a burner-rig oxidation/sulfidation test for 20 hours.

The photomicrographs of FIG. 5 show the appearance of the aluminide coated Alloy A, the MCrAlY coated Alloy B and the aluminide coated C101 after 30 hours exposure to the oxidation/sulfidation cycle. Examination of the coated alloys indicated that coated Alloys A and B had oxidation/sulfidation resistance equivalent to the coated C101 alloy, thereby indicating that coated Alloys A and B possessed excellent oxidation/sulfidation resistance.

While specific components of the present system are defined above, many other variables may be introduced which may in any way effect, enhance or otherwise improve the composition of the present invention.

Although variations are shown in the present application, many modifications and ramifications will occur to those skilled in the art upon a reading of the present disclosure. These are intended to be included herein.

We claim:

1. A single crystal alloy composition consisting essentially of, by weight, about 8.0% to about 14.0% chromium; about 1.5% to about 6.0% cobalt; about 0.5% to about 2.0% molybdenum; about 3.0% to about 10.0% tungsten; about 2.5% to about 7.0% titanium; about 2.5% to about 7.0% aluminum; about 3.0% to about 6.0% tantalum; and the balance nickel.

2. The composition of claim 1 consisting essentially of, by weight, about 9.0% to about 12.0% chromium; about 2.5% to about 5.0% cobalt; about 0.8% to about 1.5% molybdenum; about 4.0% to about 8.0% tungsten; about 2.5% to about 5.0% titanium; about 3.0% to about 6.0% aluminum; about 4.0% to about 5.0% tantalum; and the balance nickel.

3. A method for producing a heat-treated single crystal alloy material comprising:
   (a) providing a composition consisting essentially of, by weight, about 8.0% to about 14.0% chromium; about 1.5% to about 6.0% cobalt; about 0.5% to about 2.0% molybdenum; about 3.0% to about 10.0% tungsten; about 2.5% to about 7.0% titanium; about 2.5% to about 7.0% aluminum; about 3.0% to about 6.0% tantalum; and the balance nickel.
   (b) melting and directionally solidifying the composition to produce a single crystal alloy;
   (c) heat treating the material at a temperature of between about 2340° F. and about 2400° F. for about 1 to about 4 hours;
   (d) rapidly cooling the material at a rate of about 150° F. to about 250° F. per minute for at least about 6 minutes; and
   (e) reheating the material to between about 1400° F. and about 2050° F. and holding the material within this temperature range from about 2 to about 24 hours.

4. The method of claim 3 wherein said composition consists essentially of, by weight, about 9.0% to about 12.0% chromium; about 2.5% to about 5.0% cobalt; about 0.8% to about 1.5% molybdenum; about 4.0% to about 8.0% tungsten; about 2.5% to about 5.0% titanium; about 3.0% to about 6.0% aluminum; about 4.0% to about 5.0% tantalum; and the balance nickel.

5. An article of manufacture comprising a substrate material fabricated from the composition of claim 1, the substrate being coated with a layer of an aluminide deposit to impart improved high temperature oxidation/corrosion resistance thereto.

6. The article of claim 5 wherein the aluminide deposit is prepared from a NiAl alloy which contains from about 25 to about 40 percent by weight aluminum, the balance being nickel.

7. An article of manufacture comprising a substrate material fabricated from the composition of claim 1, the substrate being coated with an overlay coating to impart improved high temperature oxidation/corrosion resistance thereto, the overlay coating composition having the general formula MCrAlY wherein M is a solid solution of metal selected from the group consisting of nickel, cobalt, and mixtures of nickel and cobalt with molybdenum wherein the metals represented by M comprise 30 to 75 percent by weight of the coating, chromium comprises about 10 to about 40 percent by weight of the coating; aluminum comprises about 5 to about 20 percent by weight of the coating and yttrium comprises about 0.1 to about 1.0 percent by weight of the coating.

* * * * *